United States Patent
Fan et al.

(10) Patent No.: US 6,200,712 B1
(45) Date of Patent: Mar. 13, 2001

(54) COLOR FILTER IMAGE ARRAY OPTOELECTRONIC MICROELECTRONIC FABRICATION WITH THREE DIMENSIONAL COLOR FILTER LAYER AND METHOD FOR FABRICATION THEREOF

(75) Inventors: Yang-Tung Fan; Chih-Hsiung Lee, both of Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/252,465

(22) Filed: Feb. 18, 1999

(51) Int. Cl.[7] .......................... G02B 5/20; H01L 31/0232
(52) U.S. Cl. .................................. 430/7; 438/70
(58) Field of Search .................. 430/7; 438/35, 438/70; 257/440

(56) References Cited

U.S. PATENT DOCUMENTS

| | | | |
|---|---|---|---|
| 4,808,501 | * 2/1989 | Chiulli | 430/7 |
| 4,818,624 | 4/1989 | Downey, Jr. | 428/447 |
| 5,093,738 | 3/1992 | Watanabe et al. | 359/68 |
| 5,132,251 | * 7/1992 | Kim et al. | 437/225 |
| 5,219,615 | 6/1993 | Nakazawa et al. | 427/240 |
| 5,350,490 | * 9/1994 | Lee | 156/655 |
| 5,419,991 | 5/1995 | Segawa | 430/20 |
| 5,493,143 | * 2/1996 | Hokari | 257/432 |
| 5,578,404 | 11/1996 | Kliem | 430/7 |
| 5,623,353 | 4/1997 | Kanemoto et al. | 349/122 |
| 5,654,202 | 8/1997 | Daly et al. | 438/70 |
| 5,667,920 | 9/1997 | Chiulli et al. | 430/7 |

* cited by examiner

*Primary Examiner*—John A. McPherson
(74) *Attorney, Agent, or Firm*—George O. Saile; Stephen B. Ackerman; Stephen G. Stanton

(57) ABSTRACT

A method for forming an optoelectronic microelectronic fabrication and an optoelectronic microelectronic fabrication fabricated in accord with the method. There is first provided a substrate having at minimum a first photoactive region and a second photoactive region formed therein. There is then formed over the substrate a patterned first color filter layer registered with the first photoactive region. There is then formed upon the patterned first color filter layer a first optically transparent planarizing encapsulant layer. There is then formed upon the first optically transparent planarizing encapsulant layer a patterned second color filter layer registered with the second photoactive region. Finally, there is then formed upon the patterned second color filter layer a second optically transparent planarizing encapsulant layer. The method contemplates an optoelectronic microelectronic fabrication fabricated in accord with the method.

15 Claims, 3 Drawing Sheets

COLOR FILTER IMAGE ARRAY OPTOELECTRONIC MICROELECTRONIC FABRICATION WITH THREE DIMENSIONAL COLOR FILTER LAYER AND METHOD FOR FABRICATION THEREOF

BACKGROUND OF THE INVENTION

1. Field of the Invention

The present invention relates generally to methods for fabricating image array optoelectronic microelectronic fabrications. More particularly, the present invention relates to methods for fabricating with enhance optical resolution color filter image array optoelectronic microelectronic fabrications.

2. Description of the Related Art

Microelectronic fabrications are formed from microelectronic substrates over which are formed patterned microelectronic conductor layers which are separated by microelectronic dielectric layers. Within the general art of microelectronic fabrication, there exist microelectronic fabrications whose operation is based solely upon electrical signal storage and processing characteristics of microelectronic devices and microelectronic circuits formed upon a microelectronic substrate. Examples of such microelectronic fabrications typically include semiconductor integrated circuit microelectronic fabrications and ceramic substrate packaging microelectronic fabrications. Similarly, there also exists within the general art of microelectronic fabrication microelectronic fabrications whose operation is predicated upon a codependent transduction, storage and/or processing of optical and electrical signals while employing optoelectronic microelectronic devices formed upon a microelectronic substrate. Examples of such optoelectronic microelectronic fabrications typically include, but are not limited to: (1) solar cell optoelectronic microelectronic fabrications, as well as; (2) image array optoelectronic microelectronic fabrications, such as but not limited to: (a) sensor image array optoelectronic microelectronic fabrications (i.e. color filter sensor image arrays), as well as: (b) display image array optoelectronic microelectronic fabrications (i.e. flat panel display image arrays). Sensor image array optoelectronic microelectronic fabrications find common usage in advanced consumer products such as digital cameras, while display image array optoelectronic microelectronic fabrications are well recognized and commonly employed as visual interface elements within mobile computers.

While the level of complexity and integration of both purely electronic microelectronic fabrications and optoelectronic microelectronic fabrications continues to increase, fabrication of advanced optoelectronic microelectronic fabrications often provides unique fabrication challenges insofar as fabrication of advanced optoelectronic microelectronic fabrications requires attention to both the optical properties and the electrical properties of materials which are employed in forming such advanced optoelectronic microelectronic fabrications. For example, it is typically desirable within the art of advanced optoelectronic microelectronic fabrication to provide, while employing a readily manufacturable method, an advanced optoelectronic microelectronic fabrication with enhanced optical resolution and enhanced optical stability. Within the context of the present application, enhanced optical stability is intended as enhanced optical stability to environmental exposures such as thermal exposures, chemical exposures and radiation (such as but not limited to ultra-violet radiation) exposures.

It is thus towards the goal of forming, while employing a readily manufacturable method, an image array optoelectronic microelectronic fabrication with enhanced optical resolution and enhanced optical stability, that the present invention is directed.

Various optoelectronic microelectronic fabrication materials, apparatus and/or methods, and resulting optoelectronic microelectronic fabrications, have been disclosed in the art of optoelectronic microelectronic fabrication for forming optoelectronic microelectronic fabrications with desirable properties.

With respect more specifically to such optoelectronic microelectronic fabrication materials, Downey, Jr., in U.S. Pat. No. 4,818,624, discloses a stabilized polyvinyl alcohol material from which may be formed a light polarizing filter which theoretically may be employed within an optoelectronic microelectronic fabrication. The polyvinyl alcohol material is stabilized by treating a surface of the polyvinyl alcohol material with a silylating organosilane material.

Similarly, Chiulli et al., in U.S. Pat. No. 5,667,920, disclose a related photoresist based material for forming a patterned color filter element within a color filter layer with enhanced stability and adhesion to a substrate which is employed within an optoelectronic microelectronic fabrication. The photoresist based material is treated with a silylating material which cross-links the patterned color filter element and promotes adhesion of the patterned color filter element to the substrate.

In addition, with respect more specifically to such optoelectronic microelectronic fabrication apparatus, Nakazawa et al., in U.S. Pat. No. 5,219,615, disclose an apparatus and related method for forming over a comparatively large substrate (i.e. greater than about 150 mm×150 mm) which may be employed within an optoelectronic microelectronic fabrication a uniform layer of viscous material, such as a viscous photoresist material, which may be employed in fabricating the optoelectronic microelectronic fabrication. The method employs a squeezee coating of a thin layer of the viscous material over the substrate, followed by a spinning of the substrate to assure that the thin layer of the viscous material is evenly distributed.

Finally, with respect more specifically to such optoelectronic microelectronic fabrication methods, Watanabe et al., in U.S. Pat. No. 5,093,738, discloses a method for fabricating a color filter layer which may be employed within an optoelectronic microelectronic fabrication, where the color filter layer so formed is formed with a flat surface. The method employs forming upon a transparent substrate a first series of patterned color filter layers of at least one color element and forming upon the first series of patterned color filter layers a negative photoresist layer dyed with a different color element, such that upon photoexposing the negative photoresist layer through the transparent substrate the first series of patterned color filter layers acts as a mask such that the negative photoresist material is photoexposed and remains only between, and not upon, the first series of patterned color filter layers.

Similarly, Segawa, in U.S. Pat. No. 5,419,991, discloses a related method for fabricating for use within a display image array optoelectronic microelectronic fabrication a transparent substrate having formed thereover a series of transparent picture element electrodes arranged within a matrix and separated by accurately registered optically opaque areas. The method employs a series of patterned positive photoresist layers for patterning over the substrate a blanket transparent conductor layer from which is formed the series of patterned transparent picture element electrodes, followed by coating upon the series of patterned positive photoresist layers and the series of transparent picture element electrodes a blanket black pigmented negative photoresist layer which is subsequently photoexposed through the backside of the transparent substrate while employing the series of patterned positive photoresist layers as a mask. Unexposed portions of the blanket black pigmented negative photoresist layers and the resulting series of photoexposed patterned positive photoresist layers may then be stripped to provide the transparent substrate having the series of transparent picture element electrodes arranged within the matrix separated by the accurately registered optically opaque areas.

Further, Kliem, in U.S. Pat. No. 5,578,404, discloses a method for efficiently forming, with attenuated contamination related defects, a color filter layer within a liquid crystal display image array optoelectronic microelectronic fabrication. The method employs an imageable layer formed on an interior surface of one of a pair of substrates which is separated by a liquid crystal material, all of which comprise in part the liquid crystal display image array optoelectronic microelectronic fabrication, where the imageable layer is accurately imaged, preferably in a self aligned fashion, into a color filter layer at or near the end of the fabrication process for forming the liquid crystal display image array optoelectronic microelectronic fabrication.

Yet further, Kanemoto, in U.S. Pat. No. 5,623,353, discloses a color filter liquid crystal display image array optoelectronic microelectronic fabrication, and its method of fabrication, where the color filter liquid crystal display image array optoelectronic microelectronic fabrication has incorporated therein, with minimal process complexity, an optically opaque matrix separating adjacent patterned color filter layers within the color filter liquid crystal display image array optoelectronic microelectronic fabrication. The optically opaque matrix is formed within the color filter liquid crystal display image array optoelectronic microelectronic fabrication by modulating a thickness of liquid crystal layer such that there is effected a phase reversal between linearly polarized light passing through the portion of the liquid crystal layer where the optically opaque matrix is desired in comparison with other portions of the liquid crystal layer.

Finally, Daly et al., in U.S. Pat. No. 6,654,202, discloses a method for forming a color filter sensor image array optoelectronic microelectronic fabrication with attenuated topographic related defects within the color filter sensor image array optoelectronic microelectronic fabrication. To realize that object, there is employed when fabricating the color filter sensor image array optoelectronic microelectronic fabrication a patternable planarizing layer as a substrate layer for a color filter within the color filter sensor image array optoelectronic microelectronic fabrication.

Desirable in the art of optoelectronic microelectronic fabrication are additional methods and materials which may be employed for forming color filter image array optoelectronic microelectronic fabrications with enhanced optical resolution and enhance optical stability.

It is towards that goal that the present invention is directed.

SUMMARY OF THE INVENTION

A first object of the present invention is to provide a method for forming a color filter image array optoelectronic microelectronic fabrication, and the color filter image array optoelectronic microelectronic fabrication fabricated in accord with the method.

A second object of the present invention is to provide a method for forming a color filter image array optoelectronic microelectronic fabrication in accord with the first object of the present invention, where the color filter image array optoelectronic microelectronic fabrication is formed with enhanced optical resolution and enhanced optical stability.

A third object of the present invention is to provide a method for forming a color filter image array optoelectronic microelectronic fabrication in accord with the first object of the present invention and the second object of the present invention, which method is readily commercially implemented.

In accord with the objects of the present invention, there is provided by the present invention a method for forming an image array optoelectronic microelectronic fabrication, and the image array optoelectronic microelectronic fabrication fabricated in accord with the method. To practice the method of the present invention, there is first provided a substrate having at minimum a first photoactive region and a second photoactive region formed therein. There is then formed over the substrate a patterned first color filter layer registered with the first photoactive region. There is then formed upon the patterned first color filter layer a first optically transparent planarizing encapsulant layer. There is then formed upon the first optically transparent planarizing encapsulant layer a patterned second color filter layer registered with the second photoactive region. Finally, there is then formed upon the patterned second color filter layer a second optically transparent planarizing encapsulant layer.

The method for forming the image array optoelectronic microelectronic fabrication of the present invention contemplates the image array optoelectronic microelectronic fabrication fabricated in accord with the method.

There is provided by the present invention a method for forming an image array optoelectronic microelectronic fabrication, where the image array optoelectronic microelectronic fabrication is formed with enhanced optical resolution and enhanced optical stability. The present invention realizes the foregoing objects by employing when forming the image array optoelectronic microelectronic fabrication at least a patterned first color filter layer which is registered with a first photoactive region within a substrate and encapsulated with a first optically transparent planarizing encapsulant layer prior to forming thereupon a patterned second color filter layer which is registered with a second photoactive region within the substrate and similarly encapsulated with a second optically transparent planarizing encapsulant layer.

The method of the present invention is readily commercially implemented. The present invention employs methods and materials as are generally known within, or at least readily adaptable to, the art of optoelectronic microelectronic fabrication, and more specifically to the art of image array optoelectronic microelectronic fabrication. Since it is at least in part a process control in conjunction with design considerations which provides the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

There is provided by the present invention a method for forming an image array optoelectronic microelectronic fabrication, where the image array optoelectronic microelectronic fabrication is formed with enhanced optical resolution and enhanced optical stability. The present invention realizes the foregoing object by employing when forming the image array optoelectronic microelectronic fabrication a patterned first color filter layer registered with a first photoactive region within a substrate, where the patterned first color filter layer has formed thereupon an optically transparent first planarizing encapsulant layer which in turn has formed thereupon a patterned second color filter layer registered with a second photoactive region within the substrate, where the patterned second color filter layer has formed thereupon an optically transparent second planarizing encapsulant layer.

Although the preferred embodiment of the present invention illustrates the present invention within the context of fabricating a color filter diode sensor image array optoelectronic microelectronic fabrication, the present invention may be employed for forming with enhanced optical resolution and enhanced optical stability image array optoelectronic microelectronic fabrications including but not limited to sensor image array optoelectronic microelectronic fabrications (which sense incident electromagnetic radiation while employing photosensor photoactive regions within a substrate) and display image array optoelectronic microelectronic fabrications (which display electromagnetic radiation which is emitted from photoemissive photoactive regions within a substrate). Similarly, such photosensitive and photoemissive photoactive regions may employ photoactive elements such as but not limited to photodiodes and photocapacitors.

Figure 1:
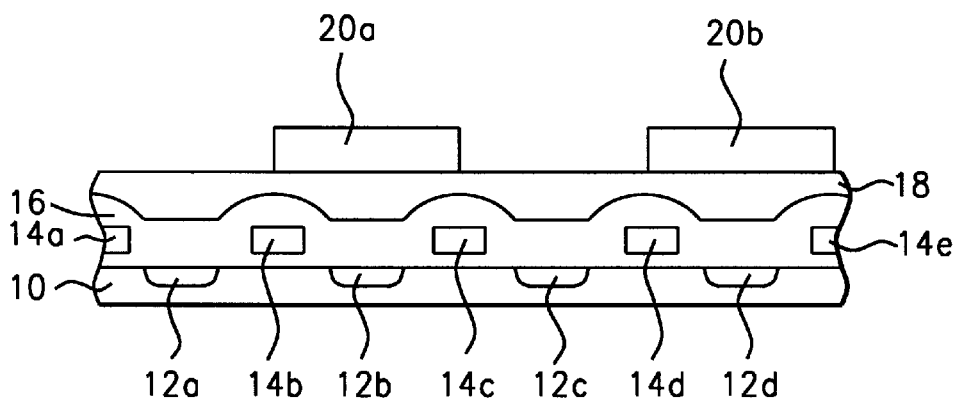
FIG. 1, FIG. 2, FIG. 3 and FIG. 4 show a series of schematic cross-sectional diagrams illustrating the results of progressive stages in forming a color filter diode sensor image array optoelectronic microelectronic fabrication in accord with the present invention.

Referring now to FIG. 1 to FIG. 4, there is shown a series of schematic cross-sectional diagrams illustrating the results of progressive stages in forming a color filter diode sensor image array optoelectronic microelectronic fabrication in accord with a preferred embodiment of the present invention. Shown in FIG. 1 is a schematic cross-sectional diagram of the color filter diode sensor image array optoelectronic microelectronic fabrication at an earlier stage in its fabrication in accord with the present invention.

Shown within FIG. 1 is a substrate 10 having formed therein a series of photoactive regions 12a, 12b, 12c and 12d. Within the preferred embodiment of the present invention, the substrate 10 is typically and preferably a silicon semiconductor substrate, and the photoactive regions 12a, 12b, 12c and 12d are typically and preferably photodiode regions of the silicon semiconductor substrate, although, as suggested above, the present invention may provide value when forming an optoelectronic microelectronic fabrication which employs a substrate other than a silicon semiconductor substrate, which substrate has formed therein, thereupon or thereover photoactive regions formed of other than photodiodes. Typically and preferably, the silicon semiconductor substrate will be a silicon semiconductor substrate having an N− or P− doping, while the photodiode photoactive regions 12a, 12b, 12c and 12d will typically and preferably have a complementary P+ or N+ doping.

Although FIG. 1 illustrates the substrate 10 as a flat substrate having the photoactive regions 12a, 12b, 12c and 12d formed contiguously therein, it is understood by a person skilled in the art that the photoactive regions 12a, 12b, 12c and 12d may also be formed topographically within the substrate 10, and the substrate 10 may also have formed therein additional appropriate layers and structures, such as but not limited to channel stop layers and structures, as are needed to adequately isolate the photoactive regions 12a, 12b, 12c and 12d.

Shown also within FIG. 1 formed upon the substrate 10 including the photoactive regions 12a, 12b, 12c and 12d of the substrate 10 is a blanket passivation layer 16 which has formed therein at locations alternating with the series of photoactive regions 12a, 12b, 12c and 12d a series of patterned conductor layers 14a, 14b, 14c, 14d and 14e. The series of patterned conductor layers 14a, 14b, 14c, 14d and 14e typically serves as a first directional charge collection array within the color filter diode sensor image array optoelectronic microelectronic fabrication whose schematic cross-sectional diagram is illustrated in FIG. 1, while the blanket passivation layer 16 serves to separate the patterned conductor layers 14a, 14b, 14c, 14d and 14e from the substrate 10.

Within the preferred embodiment of the present invention, the blanket passivation layer 16 is typically and preferably formed of a passivation material which is transparent to incident electromagnetic radiation whose detection and classification the color filter diode sensor image array optoelectronic microelectronic fabrication whose schematic cross-sectional diagram is illustrated in FIG. 1 is designed to detect and classify. Typically and preferably, the blanket passivation layer 16 is formed of a passivation material selected from the group including but not limited to silicon oxide passivation materials, silicon nitride passivation materials, silicon oxynitride passivation materials and composites thereof. Similarly, within the preferred embodiment of the present invention, the vertical patterned conductor layers 14a, 14b, 14c, 14dand 14e are each formed of a conductor material as is similarly conventional in the art of optoelectronic microelectronic fabrication, such conductor materials being selected from the group including but not limited to metal, metal alloy, doped polysilicon and polycide (doped polysilicon/metal silicide stack) conductor materials.

Shown also within FIG. 1 formed upon the blanket passivation layer 16 is a blanket planarizing layer 18, and there is similarly also shown within FIG. 1 formed upon the blanket planarizing layer 18 a pair of patterned first color filter layers 20a and 20b. Within the preferred embodiment of the present invention, the blanket planarizing 18 layer may be formed employing methods and materials as are conventional in the art of optoelectronic microelectronic fabrication. Typically and preferably, the blanket planarizing layer 18 is formed of a planarizing material which, similarly with the blanket passivation layer 16, is transparent to a spectrum of electromagnetic radiation whose detection and classification is effected while employing the color filter diode sensor image array optoelectronic microelectronic fabrication whose schematic cross-sectional diagram is illustrated in FIG. 1. Such planarizing materials may include, but are not limited to spin-on-glass (SOG) planarizing materials and spin-on-polymer (SOP) planarizing materials, such as photoresist spin-on-polymer (SOP) planarizing materials. For the preferred embodiment of the present invention, the blanket planarizing layer 18 is preferably formed of a spin-on-glass (SOG) planarizing material, preferably formed to a thickness of from about 20000 to about 30000 angstroms upon the blanket passivation layer 16.

Within the preferred embodiment of the present invention, the pair of patterned first color filter layers 20a and 20b is preferably formed of a photoresist material, preferably but not exclusively a positive photoresist material, having incorporated therein a first colorant material, although the pair of patterned first color filter layers 20a and 20b may be formed employing any of several other methods and materials. Preferably, the first colorant material is selected from the group of primary colorant materials red, blue and green and the group of secondary colorant materials yellow, cyan and magenta. Under circumstances when there is employed when forming the pair of patterned first color filter layers 20a and 20b a positive photoresist material, the pair of patterned first color filter layers 20a and 20b may typically be formed with enhanced optical resolution in comparison nominally equivalent patterned color filter layers formed employing, for example, a negative photoresist material. Under such circumstances, the pair of patterned first color filter layers 20a and 20b is also subject to ready rework, if originally improperly placed, due to the ability to photoexpose and develop, or otherwise strip from the surface of the color filter diode sensor image array optoelectronic fabrication whose schematic cross-sectional diagram is illustrated in FIG. 1 the pair of patterned first color filter layers 20a and 20b. Typically and preferably, each of the patterned first color filter layers 20a and 20b is formed to a thickness of from about 10000 to about 20000 angstroms, while each having a bidirectional linewidth of from about 5 to about 12 microns which, incident to forming each of the patterned first color filter layers 20a and 20b from a positive photoresist material, may be formed with precise registration with respect to the corresponding photoactive region 12b or 12d, thus providing the color filter diode sensor image array optoelectronic microelectronic fabrication whose schematic cross-sectional diagram is illustrated within FIG. 1 with enhanced optical resolution.

Figure 2:
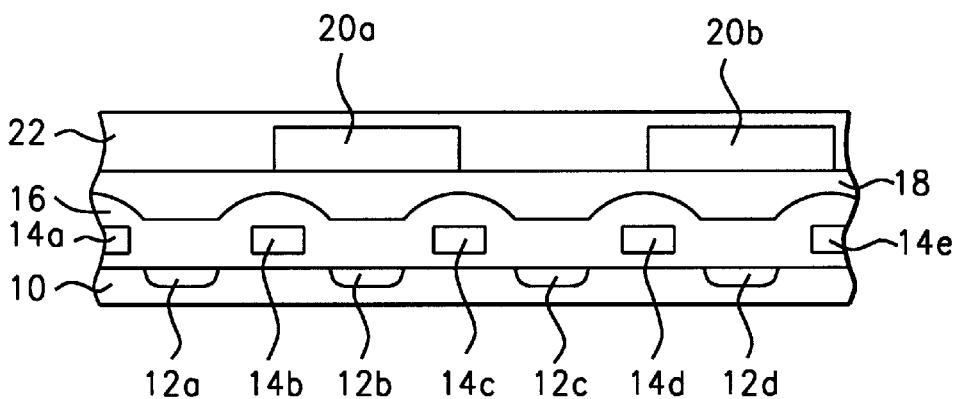

Referring now to FIG. 2, there is shown a schematic cross-sectional diagram illustrating the results of further processing of the color filter diode sensor image array optoelectronic microelectronic fabrication whose schematic cross-sectional diagram is illustrated in FIG. 1. Shown in FIG. 2 is a schematic cross-sectional diagram of a color filter diode sensor image array optoelectronic microelectronic fabrication otherwise equivalent to the color filter diode sensor image array optoelectronic microelectronic fabrication whose schematic cross-sectional diagram is illustrated in FIG. 1, but wherein there is formed upon the exposed portions of the blanket planarizing layer 18 and the pair of patterned first color filter layers 20a and 20b, a blanket first planarizing encapsulant layer 22.

Within the preferred embodiment of the present invention, the blanket first planarizing encapsulant layer 22 is preferably formed of an encapsulant material which is optically transparent to incident electromagnetic radiation whose detection and classification is effected while employing the color filter diode sensor image array optoelectronic microelectronic fabrication whose schematic cross-sectional diagram is illustrated in FIG. 2. More preferably, the blanket first planarizing encapsulant layer 22 is formed of a photopolymerizable material, such as but not limited to a negative photoresist material. Preferably, the blanket first planarizing encapsulant layer 22 is formed to a planarizing thickness of from about 10000 to about 20000 angstroms, which totally encapsulates the pair of patterned first color filter layers 20a and 20b while providing a planar surface to the blanket first planarizing encapsulant layer 22. The blanket first planarizing encapsulant layer 22 also provides enhanced optical stability to the color filter diode sensor image array optoelectronic microelectronic fabrication whose schematic cross-sectional diagram is illustrated in FIG. 2 insofar as the blanket first planarizing encapsulant layer 22, at least in particular when formed of a negative photoresist material in comparison with a positive photoresist material from which is preferably formed the pair of patterned first color filter layers 20a and 20b, is less susceptible to environmental degradation incident to exposures such as but not limited to thermal exposures, chemical exposures and ultraviolet exposures which would facilitate optical instability within the color filter diode sensor image array optoelectronic microelectronic fabrication whose schematic cross-sectional diagram is illustrated within FIG. 1.

Figure 3:
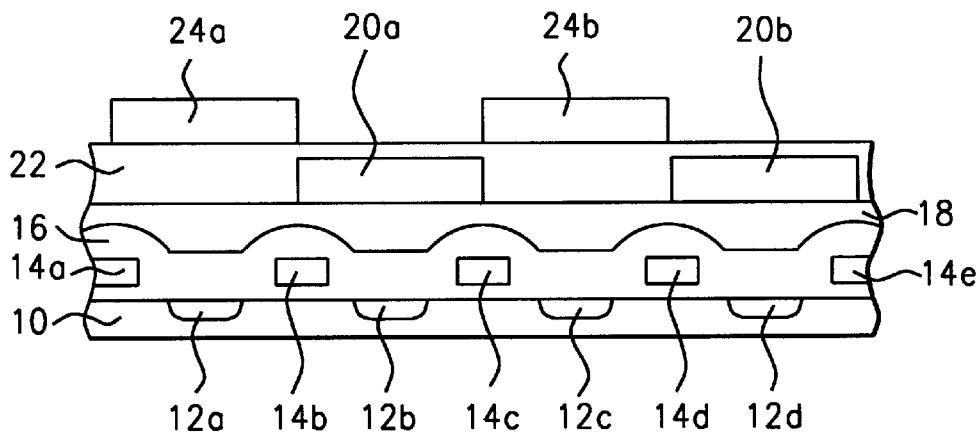

Referring now to FIG. 3, there is shown a schematic cross-sectional diagram illustrating the results of further processing of the color filter diode sensor image array optoelectronic microelectronic fabrication whose schematic cross-sectional diagram is illustrated in FIG. 2. Shown in FIG. 3 is a schematic cross-sectional diagram of a color filter diode sensor image array optoelectronic microelectronic fabrication otherwise equivalent to the color filter diode sensor image array optoelectronic microelectronic fabrication whose schematic cross-sectional diagram is illustrated in FIG. 2, but wherein there is formed upon the blanket first planarizing encapsulant layer 22 a pair of patterned second color filter layers 24a and 24b, each registered with a corresponding photoactive region 12a or 12c within the substrate 10.

Within the preferred embodiment of the present invention, the patterned second color filter layers 24a and 24b are formed employing methods and materials analogous or equivalent to the methods and materials employed for forming the pair of patterned first color filter layers 20a and 20b, but with the exception that the pair of patterned second color filter layers 24a and 24b will typically and preferably, although not necessarily exclusively, employ a colorant other than the colorant employed when forming patterned first color filter layers 20a and 20b.

Figure 4:
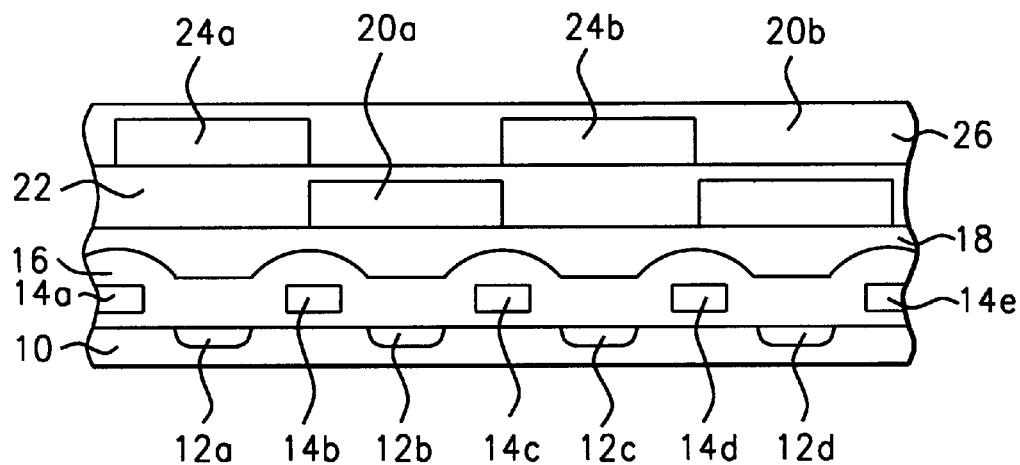

Referring now to FIG. 4, there is shown a schematic cross-sectional diagram illustrating the results of further processing of the color filter diode sensor image array optoelectronic microelectronic fabrication whose schematic cross-sectional diagram is illustrated in FIG. 3. Shown in FIG. 4 is a schematic cross-sectional diagram of a color filter diode sensor image array optoelectronic microelectronic fabrication otherwise equivalent to the color filter diode sensor image array optoelectronic microelectronic fabrication whose schematic cross-sectional diagram is illustrated in FIG. 3, but wherein there is formed upon exposed portions of the blanket first planarizing encapsulant layer 22 and the patterned second color filter layers 24a and 24b a blanket second planarizing encapsulant layer 26.

Within the preferred embodiment of the present invention, the blanket second planarizing encapsulant layer 26 is preferably formed employing methods, materials and dimensions analogous or equivalent to the methods, materials and dimensions employed for forming the blanket first planarizing encapsulant layer 22.

Upon forming the color filter diode sensor image array optoelectronic microelectronic fabrication whose schematic cross-sectional diagram is illustrated in FIG. 4, there is formed a color filter diode sensor image array optoelectronic microelectronic fabrication with enhanced optical resolution and enhanced optical stability. The color filter diode sensor image array optoelectronic microelectronic fabrication whose schematic cross-sectional diagram is illustrated in FIG. 4 realizes that object by employing when forming the color filter diode sensor image array optoelectronic microelectronic fabrication a patterned first color filter layer formed over and registered with a first photoactive region within a substrate employed within an optoelectronic microelectronic fabrication, where the patterned first color filter layer has formed thereupon a blanket first planarizing encapsulant layer prior to forming upon the blanket first planarizing encapsulant layer a patterned second color filter layer which is registered with a second photoactive region within the substrate, where the patterned second color filter layer in turn has formed thereupon a blanket second planarizing encapsulant layer.

As is understood by a person skilled in the art, although FIG. 1 to FIG. 4 illustrate schematic cross-sectional diagrams of a color filter diode sensor image array optoelectronic microelectronic fabrication which illustrate only two dimensions of the color filter diode sensor image array optoelectronic microelectronic fabrication, the color filter diode sensor image array optoelectronic microelectronic fabrication of the preferred embodiment of the present invention extends also in a third direction to form a fully bidirectional array.

As is similarly also understood by a person skilled in the art, the color filter diode sensor image array optoelectronic microelectronic fabrication whose schematic cross-sectional diagram is illustrated in FIG. 4 may be further fabricated by formation of additional layers thereupon to provide a more fully functional or refined color filter diode sensor image array optoelectronic microelectronic fabrication. Such additional layers may include, but are not limited to additional blanket planarizing layers or additional blanket passivation layers, as well as additional microlens layers whose function is to focus incident electromagnetic radiation with respect to each of the photoactive regions 12a, 12b, 12c and 12d. Similarly, there may also be employed when forming a color filter diode sensor image array optoelectronic microelectronic fabrication derived from the color filter diode sensor image array optoelectronic microelectronic fabrication whose schematic cross-sectional diagram is illustrated in FIG. 4 patterned color filter layers provided or arranged to encompass three, rather than two color elements.

EXAMPLE

There were obtained two quartz plates each of a real dimensions about 150 by about 150 millimeters and thickness dimension about 0.76 millimeters. There was then coated upon each of the two quartz plates a layer of product number CCD 186 positive photoresist material supplied by Polaroid Corporation, into which was incorporated a loading of a blue dye colorant material. Each of the two layers of positive photoresist material was coated and thermally cured at a temperature of about 100 degrees centigrade to provide a thickness of about 13000 angstroms. Each of the two layers of positive photoresist material was then exposed to a developer as is commonly employed to develop photoexposed portions of the positive photoresist material.

An optical transmission spectrum of one of the two developed positive photoresist layers was then obtained.

One of the two developed positive photoresist layers was then hardbaked at a temperature of about 220 degrees centigrade for a time period of about 6 minutes.

An optical transmission spectrum of the hardbaked developed positive photoresist layer was then obtained.

The other of the two developed positive photoresist layers was then coated with an optically transparent blanket planarizing encapsulant layer formed of a product name CT encapsulant material available from JSR, Japan to a planarizing thickness of about 15000 angstroms and cured via exposure from a 2000 watt mercury lamp for a time period of about 30 seconds. The encapsulated developed positive photoresist layer was then also hardbaked at a temperature of about 220 degrees centigrade for a time period of about 6 minutes.

An optical transmission spectrum of the hardbaked encapsulated developed positive photoresist was then obtained.

Figure 5:
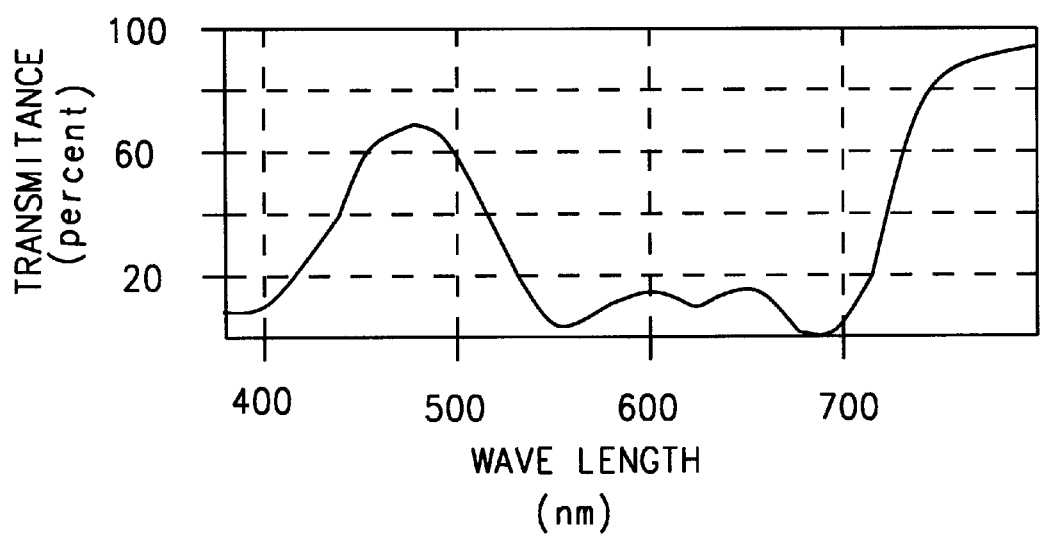
FIG. 5, FIG. 6 and FIG. 7 show a series of plots of Transmittance versus Wavelength for a color filter layer directed to and in accord with an example of the present invention.
Figure 6:
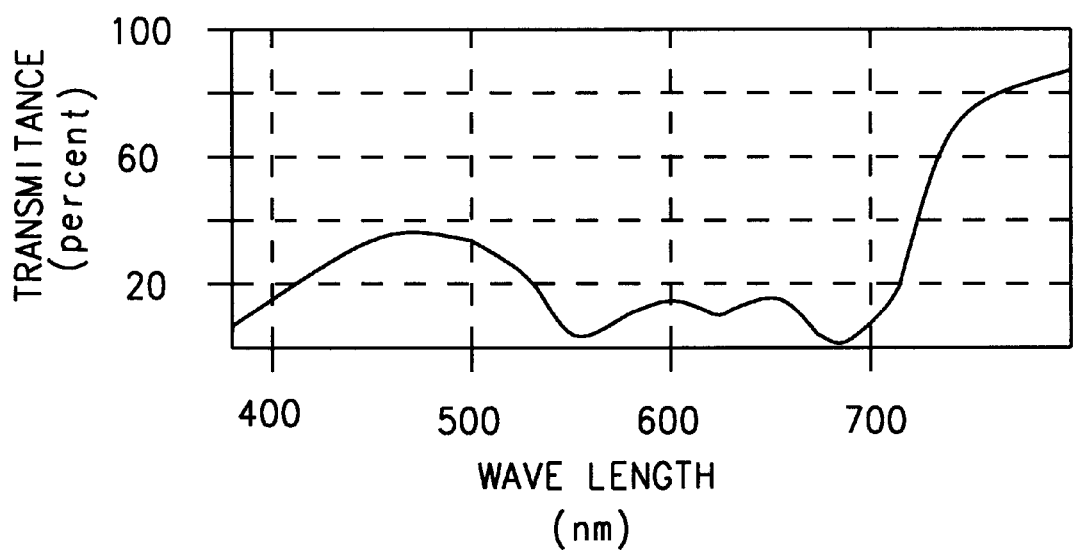
Figure 7:
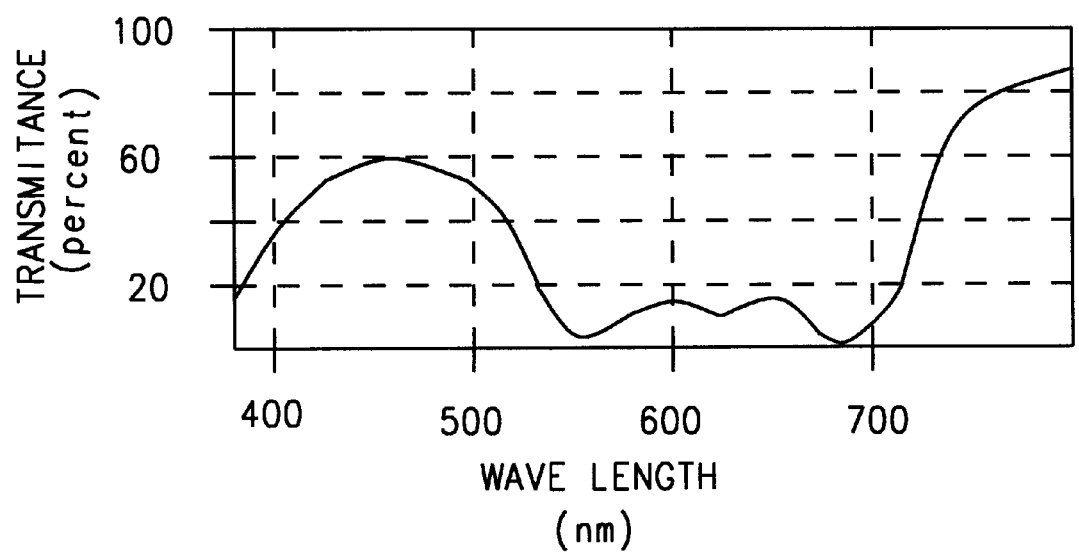

The three optical transmission spectra are shown in FIG. 5, FIG. 6 and FIG. 7, where the optical transmission spectrum of FIG. 5 corresponds with the developed positive photoresist layer, the optical transmission spectrum of FIG. 6 corresponds with the hardbaked developed positive photoresist layer and the optical transmission spectrum of FIG. 7 corresponds with the hardbaked encapsulated developed positive photoresist layer.

As is seen from review of the optical transmission spectra of FIG. 5, FIG. 6 and FIG. 7, there is observed limited change in optical transmission within the visible wavelength region for the hardbaked encapsulated developed positive photoresist layer, in comparison with the hardbaked developed positive photoresist layer. Thus, it is presumed that there may be formed in accord with the preferred embodiment of the present invention a color image array optoelectronic microelectronic fabrication with enhanced optical resolution and enhanced optical stability.

As is understood by a person skilled in the art, the preferred embodiment and example of the present invention are illustrative of the present invention rather than limiting of the present invention. Revisions and modifications may be made to methods, materials, structures and dimensions which are employed to form a color filter diode sensor image array optoelectronic microelectronic fabrication in accord with the preferred embodiment and example of the present invention while still forming an image array optoelectronic microelectronic fabrication in accord within the present invention, as defined by the appended claims.

What is claimed is:

1. A method for forming an optoelectronic microelectronic fabrication comprising:

providing a substrate having at minimum a first photoactive region and a second photoactive region formed therein;

forming over the substrate a patterned first color filter layer registered with the first photoactive region; the patterned first color filter layer formed employing a first positive photoresist material having incorporated therein a first colorant material;

forming upon the patterned first color filter layer a first optically transparent planarizing encapsulant layer; the first optically transparent planarizing encapsulant layer formed of an optically transparent negative photoresist material;

forming upon the first optically transparent planarizing encapsulant layer a patterned second color filter layer registered with the second photoactive region; the patterned second color filter layer formed employing a second positive photoresist material having incorporated therein a second colorant material; and forming upon the patterned second color filter layer a second optically transparent planarizing encapsulant layer; the second optically transparent planarizing encapsulant layer formed of an optically transparent negative photoresist material;

whereby at least the first optically transparent planarizing encapsulant layer provides enhanced optical stability to the optoelectronic microelectronic fabrication.

2. The method of claim 1 wherein the substrate is employed within an optoelectronic microelectronic fabrication selected from the group consisting of sensor image array optoelectronic microelectronic fabrications and display image array optoelectronic microelectronic fabrications.

3. The method of claim 1 wherein:

the substrate is a semiconductor substrate; and the photoactive region is a photodiode formed within the semiconductor substrate.

4. The method of claim 1, wherein the patterned first and second color filter layers have a thickness of from about 10,000 to 20,000 Å; and the first and second optically transparent planarizing encapsulant layers have a thickness of from about 10,000 to 20,000 Å that totally encapsulates the respective patterned first and second color filter layers.

5. The method of claim 1, wherein the patterned first and second color filter layers each have a bi-directional linewidth of from about 5 to 12 microns.

6. The method of claim 1, wherein the patterned first color filter layer includes a first colorant material selected from the group consisting of red, blue, green, yellow, cyan, and magenta; and the patterned second color filter layer includes a second colorant material selected from the group consisting of red, blue, green, yellow, cyan, and magenta that is not the same as the first colorant material.

7. The method of claim 1, wherein the first and second color filter layers each have a bi-directional linewidth of from about 5 to 12 microns; the patterned first color filter layer includes a first colorant material selected from the group consisting of red, blue, green, yellow, cyan, and magenta; and the patterned second color filter layer includes a second colorant material selected from the group consisting of red, blue, green, yellow, cyan, and magenta that is not the same as the first colorant material.

8. A method for forming an optoelectronic microelectronic fabrication comprising:

providing a substrate having at minimum a first photoactive region and a second photoactive region formed therein;

forming over the substrate a patterned first color filter layer registered with the first photoactive region; the patterned first color filter layer having a thickness of from about 10,000 to 20,000 Å and formed employing a first positive photoresist material having incorporated therein a first colorant material;

forming upon the patterned first color filter layer a first optically transparent planarizing encapsulant layer having a thickness of from about 10,000 to 20,000 Å that totally encapsulates the patterned first color filter layer; the first optically transparent planarizing encapsulant layer formed of an optically transparent negative photoresist material;

forming upon the first optically transparent planarizing encapsulant layer a patterned second color filter layer registered with the second photoactive region; the patterned second color filter layer having a thickness of from about 10,000 to 20,000 Å and formed employing a second positive photoresist material having incorporated therein a second colorant material; and forming upon the patterned second color filter layer a second optically transparent planarizing encapsulant layer having a thickness of from about 10,000 to 20,000 Å that totally encapsulates the patterned first color filter layer; the second optically transparent planarizing encapsulant layer formed of an optically transparent negative photoresist material;

whereby at least the first optically transparent planarizing encapsulant layer provides enhanced optical stability to the optoelectronic microelectronic fabrication.

9. The method of claim 8, wherein the first and second color filter layers each have a bi-directional linewidth of from about 5 to 12 microns.

10. The method of claim 8, wherein the patterned first color filter layer includes a first colorant material selected from the group consisting of red, blue, green, yellow, cyan, and magenta; and the patterned second color filter layer includes a second colorant material selected from the group consisting of red, blue, green, yellow, cyan, and magenta that is not the same as the first colorant material.

11. The method of claim 8, wherein the first and second color filter layers each have a bi-directional linewidth of from about 5 to 12 microns; the patterned first color filter layer includes a first colorant material selected from the group consisting of red, blue, green, yellow, cyan, and magenta; and the patterned second color filter layer includes a second colorant material selected from the group consisting of red, blue, green, yellow, cyan, and magenta that is not the same as the first colorant material.

12. A method for forming an optoelectronic microelectronic fabrication comprising:

providing a substrate having at minimum a first photoactive region and a second photoactive region formed therein;

forming over the substrate a patterned first color filter layer registered with the first photoactive region; the patterned first color filter layer having a bi-directional linewidth of from about 5 to 12 microns and formed employing a first positive photoresist material having incorporated therein a first colorant material;

forming upon the patterned first color filter layer a first optically transparent planarizing encapsulant layer; the first optically transparent planarizing encapsulant layer formed of an optically transparent negative photoresist material;

forming upon the first optically transparent planarizing encapsulant layer a patterned second color filter layer registered with the second photoactive region; the patterned second color filter layer having a bi-directional linewidth of from about 5 to 12 microns and formed employing a second positive photoresist material having incorporated therein a second colorant material; and forming upon the patterned second color filter layer a second optically transparent planarizing encapsulant layer; the second optically transparent planarizing encapsulant layer formed of an optically transparent negative photoresist material;

whereby at least the first optically transparent planarizing encapsulant layer provides enhanced optical stability to the optoelectronic microelectronic fabrication.

13. The method of claim 12, wherein the patterned first and second color filter layers have a thickness of from about 10,000 to 20,000 Å; and the first and second optically transparent planarizing encapsulant layers have a thickness of from about 10,000 to 20,000 Å that totally encapsulates the respective patterned first and second color filter layers.

14. The method of claim 12, wherein the patterned first color filter layer includes a first colorant material selected from the group consisting of red, blue, green, yellow, cyan, and magenta; and the patterned second color filter layer includes a second colorant material selected from the group consisting of red, blue, green, yellow, cyan, and magenta that is not the same as the first colorant material.

15. The method of claim 12, wherein the patterned first and second color filter layers have a thickness of from about 10,000 to 20,000 Å; the first and second optically transparent planarizing encapsulant layers have a thickness of from about 10,000 to 20,000 Å that totally encapsulates the respective patterned first and second color filter layers; the patterned first color filter layer includes a first colorant material selected from the group consisting of red, blue, green, yellow, cyan, and magenta; and the patterned second color filter layer includes a second colorant material selected from the group consisting of red, blue, green, yellow, cyan, and magenta that is not the same as the first colorant material.

* * * * *